United States Patent [19]
Shor et al.

[11] Patent Number: 5,963,076
[45] Date of Patent: *Oct. 5, 1999

[54] CIRCUIT WITH HOT-ELECTRON PROTECTION AND METHOD

[75] Inventors: Joseph Shor, Raanana; Mark Yosefin, Beit Hakerem Jerusalem; Dan Mauricio Bruck, Rishon Le Zion, all of Israel

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/837,136

[22] Filed: Apr. 14, 1997

[51] Int. Cl.$^6$ ........................................................ H03K 5/08
[52] U.S. Cl. ............................ 327/313; 327/17; 327/327; 327/437
[58] Field of Search ..................................... 327/108, 170, 327/310, 313, 327, 328, 375, 391, 437; 326/87; 361/56, 91

[56] References Cited

U.S. PATENT DOCUMENTS

| | | | |
|---|---|---|---|
| 4,199,695 | 4/1980 | Cook et al. . | |
| 4,347,447 | 8/1982 | Proebsting . | |
| 4,521,698 | 6/1985 | Taylor . | |
| 4,779,013 | 10/1988 | Tanaka | 326/27 |
| 4,900,955 | 2/1990 | Kurpan | 327/306 |
| 4,956,569 | 9/1990 | Olivo et al. | 326/81 |
| 5,054,001 | 10/1991 | Guillot | 326/83 |
| 5,157,280 | 10/1992 | Schreck et al. | 327/537 |
| 5,347,179 | 9/1994 | Casper et al. . | |
| 5,493,244 | 2/1996 | Pathak et al. | 327/313 |
| 5,629,645 | 5/1997 | Okajima et al. | 327/399 |
| 5,650,742 | 7/1997 | Hirano | 327/333 |
| 5,748,025 | 5/1998 | Ng et al. | 327/333 |
| 5,767,728 | 6/1998 | Michail et al. | 327/374 |

OTHER PUBLICATIONS

Dr.–Ing. Ulrich Tietze, "Halbleiter–Schaltungstechnik", ISBN 3–540–56184–6 10.Aufl. Springer–Verlag Berlin Heidelbert New York, 1993, pp. 213–218.

Jerry C. Whitaker, "The Electronics Handbook", 1996 by CRC Press, Inc., pp. 679–683.

Yusuf Leblebici , "Design Considerations for CMOS Digital Circuits with improved hot–carrier reliability" in IEEE Journal of solid–state Circuits, vol. 31, No. 7, Jul. 1996, pp. 1014–1024.

*Primary Examiner*—Terry D. Cunningham

[57] ABSTRACT

In a circuit (10), a first N-FET (N1) and a second N-FET (N2) are coupled serially between a node (15) and ground (93). The circuit (10) accommodates a first excursion (85) of a first signal (IN) at the gates of the first N-FET (N1) which is higher than the maximum allowable drain-source voltage for N-FETs. The voltage of a second signal (OUT) between the node (15) and ground (93) is distributed across the first and the second N-FETs (N1, N2). The gate voltage of the second N-FET (N2) is not constant, but controlled by a control circuit (20) receiving signals the first signal (IN) and, optionally, the second signal (OUT). With the variation of the gate voltage for the second N-FET (N2), the size of both transistors (N1, N2) can be reduced and the fall time ($T_F$) of the second signal (OUT) can be reduced.

12 Claims, 3 Drawing Sheets

CIRCUIT WITH HOT-ELECTRON PROTECTION AND METHOD

FIELD OF THE INVENTION

This invention relates to electronic devices, and especially to input-output circuits and to a method for operating input-output circuits.

BACKGROUND OF THE INVENTION

Advances in very large scale integration (VLSI) fabrication techniques for integrated circuits (IC) are based on reduced transistor dimensions (e.g., channel length) without a proportional scaling of the reference voltages. The reduction of critical transistor dimensions results in a significant increase of the electrical fields in the transistors. When for example, a N-channel field effect transistor (FET) is conductive in the deep saturation region, then its gate oxide can be damaged by high electrical fields. The results are, for example, longer delay times and a lower long-term reliability of the IC. Consequences known in the art under the terms 'hot-carrier induced degradation' and 'hot electron effects' are described in [1] Leblebici, Y.: Design Considerations for CMOS Digital Circuits with Improved Hot-Carrier Reliability, IEEE J. of Solid State Circuits, vol. 31, No. 7, p. 1014–1024 (1996).

A particular problem and its prior art solution are illustrated in FIGS. 1–2 by way of example. FIG. 1 is a simplified circuit diagram of a prior art input-output circuit 50'. Circuit 50' comprises N-FET N1' and P-channel field effect transistor P1' ("P-FET"), input terminal 12' and output node 15'. For convenience, the sources and drains of the FETs are indicated by the symbols 'S' and 'D', respectively. The gate of P-FET P1' is marked with a circle. P-FET P1' and N-FET N1' are serially coupled between first reference line 91' at e.g., 3.6 volts and ground 93' at e.g., 0 volt. Output node 15' is formed by the common drains of P-FET P1' and N-FET N1'. Input terminal 12' is coupled to the gates of N-FET N1' and P1'. It is well know in the art, that depending on an input voltage between input terminal 12' and ground 93', one of the FETs closes (becomes conductive) and the other FETs opens (becomes non-conductive). Output node 15' is alternatively pulled up to first reference line 91' (to e.g., 3.6 volts) or down to ground 93'.

There are instances in the design of circuit 50' or similar circuits when the input voltage (i.e., the gate-source voltage $V_{GS}$ of N-FET N1) exceeds a maximal allowable drain-source voltage $V_{DSmax}$ of N-FET N1. Also, the drain-source voltage $V_{DS1}$ of N-FET N1' can exceed $V_{DSmax}$ when output node 15' is pulled up. The drain-source voltage $V_{DS1}$ of N-FET N1' must be limited to a value of $V_{DSmax}$ to avoid degradation and other unwanted effects.

FIG. 2 is a simplified circuit diagram of a further prior art input-output circuit 50". In FIG. 2, the elements which have double primed numbers correspond to the elements of FIG. 1 which have single primed numbers. The drain-source voltage $V_{DS1}$ across N-FET N1" is limited by additional N-FET N2. N-FET N2 is serially coupled between node 15" and N-FET N1". The gate of N-FET N2 is coupled to second reference line 92 at an intermediate voltage of e.g., between 1.8 and 2.5 volts. N-FET N2 is always conductive and adds a voltage $V_{DS2}$ to $V_{DS1}$. The maximum drain-source voltage $V_{DS1}$ of N-FET N1" will be substantially equal to the voltage at the gate of N-FET N2 minus a threshold voltage Vt. Thus, N-FET N2 reduces $V_{DS1}$ of N-FET N1" to the voltage at reference line 92 minus Vt. However, N-FET N2 is not fully conductive with the intermediate voltage at its gate. It is inconvenient to permanently couple the gate of N-FET N2 to first reference line 91" (at e.g., 3.6 volts) because $V_{DS1}$ across N-FET N1" could in that case exceed $V_{DSmax}$ for N-FET N1". When the gate of N-FET N2 is biased by second reference line 92, the conductivity of N-FET N2 is reduced in comparison to a equal sized N-FET N1". Therefore, N-FET N2 has a substantially larger width then N-FET N1". Operation speed must be bought by silicon area which increases costs.

The above mentioned hot-carrier induced degradation is more critical for N-FETs than for P-FETs. For P-FETs, the maximal allowable source-gate voltage $V_{SGmax}$ is in many cases equal to the maximal allowable source-drain voltage $V_{SDmax}$. For example, typical values of the maximal voltages are $V_{SGmax}=V_{SDmax}=3.6$ volts for P-FETs and $V_{DSmax}=2.75$ volts and $V_{GSmax}=3.6$ volts for N-FETs. Other prior art circuits are described in U.S. Pat. Nos. 4,521,689-Taylor [2] and 5,347,179-Casper [3]. These and other prior art approaches suffer from a number of disadvantages well known in the art. This invention seeks to provide a circuit which mitigates the mentioned and other disadvantages.

DETAILED DESCRIPTION OF THE PREFERRED EMBODIMENT

According to the present invention, a first transistor is protected by a serially coupled second transistor. A control circuit responds to changes of an input signal and, optionally, of an output signal. The control circuit changes a gate voltage of the second transistor and makes the second transistor partly conductive or fully conductive. Thereby, the voltage across the first transistor ($V_{DS}$) is by an threshold voltage amount (|Vt|) lower than the voltage at the gate of the second transistor and does therefore not exceed the allowable value. The present invention will be more fully understand in connection with FIGS. 3–5 and the text which follows.

The present invention is useful but not limited to CMOS-technology using N-channel and P-channel field effect transistors (N-FETs, P-FETs). The FETs have a control electrode (gate, G), a first electrode (drain, D) and a second electrode (source, S). Since FETs are typically symmetrical components, the true designation of "source" and "drain" is only possible once a voltage is impressed on the terminals. The designations of source and drain herein should be interpreted, therefore, in the broadest sense. The terms 'FET' and 'transistor' used as synonyms are intended to include any component having current and control electrode, such as for example, bipolar components. As a person of skill in the art understands, these components can in the broadest sense also be considered as variable resistances being controlled by signals. The terms 'first type' and 'second type' are intended to distinguish complementary transistors of opposite conductivity. Preferably, transistors of the first type are N-FETs and transistors of the second type are P-FETs. This is convenient, but not essential for the present invention. Other configurations and manufacturing technologies can also be used, as will be understood by persons skilled in the art. Preferably, the bulks of the FETs are coupled to a reference line for receiving a reference voltage. For simplicity, the bulks are not shown on the simplified schematic diagrams discussed below.

Figure 3:
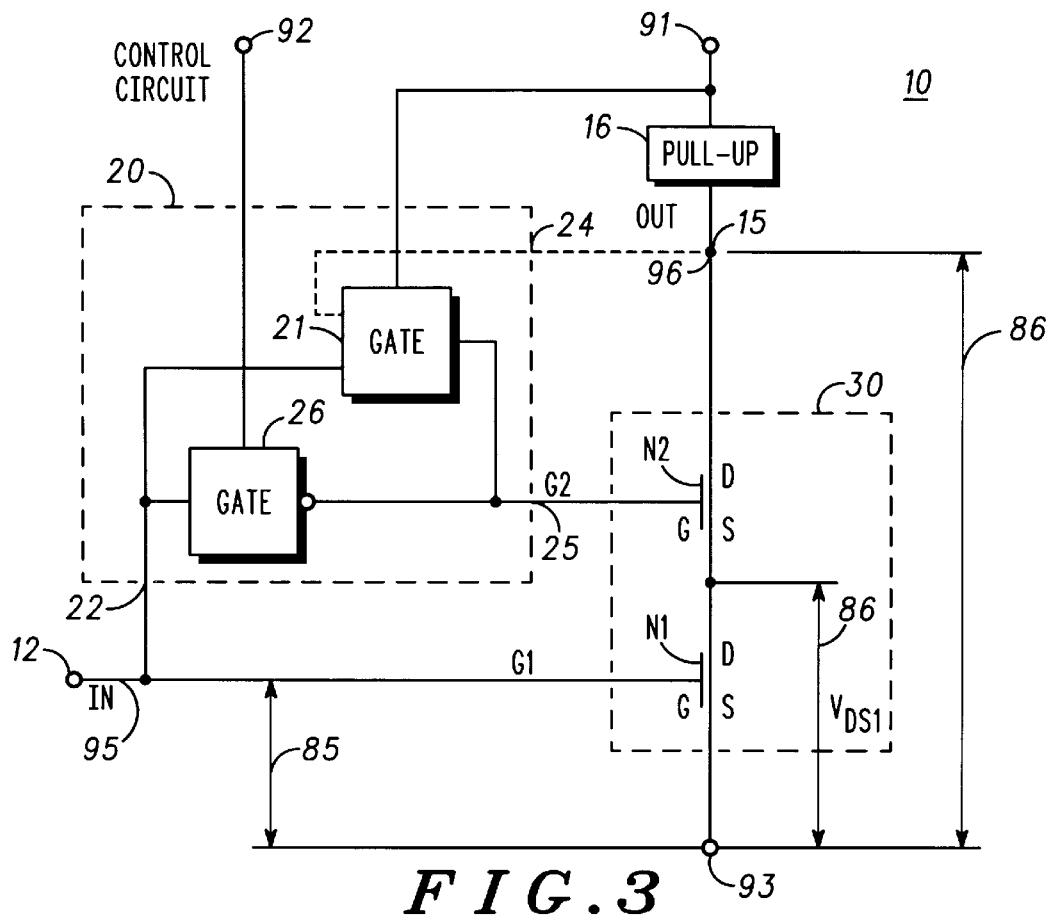
FIG. 3 is a simplified circuit diagram of an input-output circuit according to the invention.

FIG. 3 is a simplified circuit diagram of circuit 10 according to the present invention. Circuit 10 comprises transistor pair 30 (dashed), node 15, and control circuit 20 (dashed). Circuit 10 is coupled to first reference line 91 at a first reference potential (hereinafter VCCH), to second reference line 92 at a second reference potential (hereinafter VCCL), and to ground reference line 93 (hereinafter ground 93) at a ground reference potential (hereinafter ZERO). Circuit 10 receives first signal 95 (as input signal, hereinafter IN) at input terminal 12. IN has first excursion 85 relative to ground 93 of, preferably, VCCH-ZERO. Second signal 96 (hereinafter OUT) at node 15 has second excursion 86 relative to ground 93 of, preferably, VCCH-ZERO. Node 15 is coupled to first reference line 91 via a pull-up driver 16. Pull-up driver 16 can be controlled by first signal 95 or any other signals. Pull-up driver 16 is not essential for the description of the invention and therefore not explained further.

The terms 'up' and 'pull up' for components and signals as used here or elsewhere in this specification are a convenient abbreviation for a first direction. The first direction for signals is defined from ground 93 to first reference line 91, a second, opposite direction is defined in the opposite sense ("pull down", "down"). A person of skill in the art understands that signals are distinguished by quantities, such as for example of voltages, currents, or intensities. Such quantities are referred to by the term "level". In reference to the figures which explain the present invention by way of example, the term "first level" expresses a voltage substantially at VCCH, "second level" expresses a voltage substantially at VCCL and "ground level" expresses a voltage substantially at ZERO.

Transistor pair 30 has first transistor N1 and second transistor N2. The source (S) of first transistor N1 is coupled to ground 93. The drain (D) of first transistor N1 is coupled to node 15 via second transistor N2. The gate (G) of first transistor N1 is coupled to input terminal 12. First transistor N1 receives first control signal G1 which is derived from IN. As shown in the simplified circuit diagram of FIG. 3, first control signal G1 is identical to IN. This is convenient, but not essential for the invention.

The drain (D) of second transistor N2 is coupled to node 15 and the source (S) of second transistor N2 is coupled to the drain (D) of first transistor N1. The gate (G) of second transistor N2 is coupled to output 25 of control circuit 20. At output 25, control circuit 20 provides second control signal G2 with two alternative levels. Second control signal G2 is at, preferably, either VCCH (first level) or VCCL (second level). Control circuit 20 has first control input 22 coupled to input terminal 12 and optional second control input 24 coupled to node 15. As an example for explanation, and not intended to be limiting, FIG. 3 shows control circuit 20 having a first gate 21 and a second gate 26. Gates 21 and 26 have their outputs coupled together to output 25. The inputs of gate 21 are coupled to first control input 22 (signal IN) and, optionally, to second control input 24 (signal OUT at dashed line). Gate 21 is powered from first reference line 91 and provides G2 at VCCH (logical "1") for OUT at VCCH (logical "1") AND IN at VCCH (logical "1"). In case, OUT is not applied, gate 21 provides G2 at VCCH for IN at VCCH. Gate 26 is powered from second reference line 92. G2 is therefore at VCCL (logical "1") for IN at ZERO (logical "0").

When first transistor N1 is made conductive by first control signal G1=VCCH (when e.g., G1=IN), node 15 is pulled to ground 93 and OUT goes to logical "0" at OUT=ZERO. Second control signal G2 at the gate of transistor N2 is either VCCL or VCCH. Thereby, the conductivity of transistor N2 varies between a low and a high conductivity. If node 15 (signal OUT) is pulled up to VCCH by pull-up driver 16, the voltage of logical "1" at node 15 (second excursion 86) is distributed across transistor N1 and transistor N2. If node 15 is being pulled by N1 and N2 to ground 93, second excursion 86 is also distributed across N1 and N2. In all cases, the drain-source voltages $V_{DS1}$ across N1 and $V_{DS2}$ across N2 are smaller than the maximum allowable voltage $V_{DSmax}$.

Figure 4:
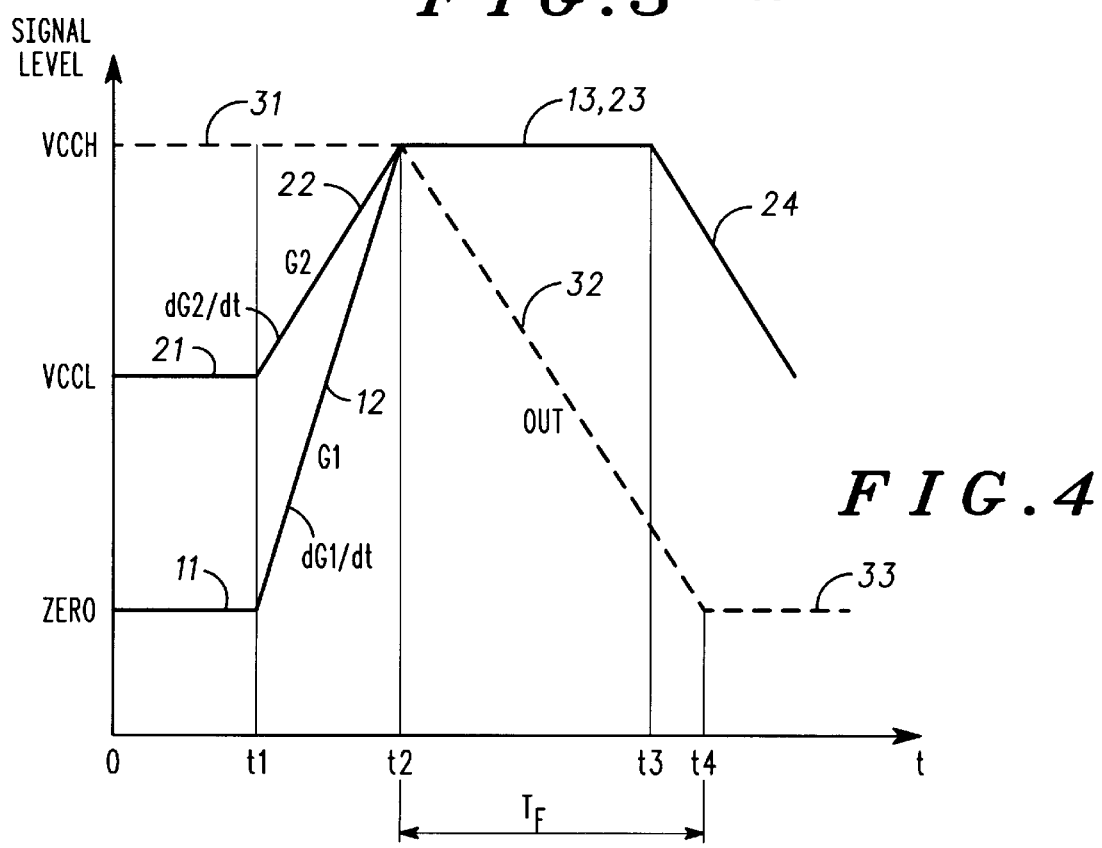
FIG. 4 is a simplified signal-time diagram illustrating a first control signal, a second control signal, and an output signal in the circuit of the invention.

FIG. 4 is a simplified signal-time diagram illustrating first control signal G1, second control signal G2, and output signal OUT in circuit 10 of the invention. FIG. 4 illustrates the method of the invention. Signal levels VCCH, VCCL, and ZERO of signals G1 (traces 11–13), G2 (traces 21–24) and OUT (traces 31–33, dashed) are indicated vertically. The time t is indicated horizontally. For simplicity, the signal forms are simplified and the diagram axis are not scaled.

Assume that at t=0, the signals (traces 11, 21, 31) are at the following levels: G1=ZERO, G2=VCCL and OUT= VCCH. First transistor N1 is not conductive and second transistor N2 is conductive with a low conductivity. $V_{DS1}$ of N1 is substantially equal to VCCL-Vt.

Between t=t1 and t=t2, IN increases to G1=IN=VCCH (trace 12). At the same time, second control signal G2 increases from G2=VCCL to G2=VCCH (trace 22). First transistor N1 becomes conductive. The conductivity of second transistor N2 gets higher. As it can be seen in FIG. 4, G1 increases faster than G2. In other words, first increase rate dG1/dt of G1 is higher than second increase rate dG2/dt of G2. Between t1 and t2, second signal OUT is still at OUT=VCCH (trace 31). This high voltage (VCCH) of second excursion 86 is distributed across first transistor N1 and second transistor N2. The drain-source voltages $V_{DS1}$ of first transistor N1 and $V_{DS2}$ of second transistor N2 (first and second voltages) are less than the maximal allowable voltage $V_{DSmax}$.

At t=t2, the output signal OUT begins to decrease (trace 32). As a person of skill in the art will understand, OUT can begin decreasing before t2, other than shown in such a simplified diagram of FIG. 4. First control signal G1 (trace 13) and second control signal G2 (trace 23) are at VCCH. From t=t3, second control signal G2 returns to VCCL (trace 24). OUT reaches ZERO at t=t4. In FIG. 4, t4 is shown after t3. This is convenient but not essential. The time interval between t2 and t4 is the fall time $T_F$ of OUT. After t4, pull-up driver 16 can place a value of VCCH on node 15. $V_{DS1}$ of N-FET N1 will be VCCL-$V_t$, while $V_{DS2}$ of N-FET N2 will be VCCH-(VCCL-Vt). Both $V_{DS1}$ and $V_{DS2}$ are lower than $V_{DSmax}$.

This is an advantage of circuit 10 of the present invention over prior art circuit 50. N-FET N2 has either low conductance (G2 at VCCL when N1 is not conducting) or high conductance (G2 at VCCH when N1 is conducting). Second voltage $V_{DS2}$ across N-FET N2 is variable between $V_{DSmax}$ and $V_{DSmin}$ and is controlled by control circuit 20 so that both voltages $V_{DS1}$ and $V_{DS2}$ remain smaller than the maximum allowable value $V_{DSmax}$. If G2 would be all the time at VCCL, then the conductivity of N-FET N2 would be reduced substantially, thus delaying the pull-down operation. On the other hand, if G2 would be fixed at VCCH and pull-up driver 16 pulls node 15 up to VCCH, then the voltage $V_{DS1}$ would become greater than $V_{DSmax}$ (VCCH-Vt). The added benefit of the present invention is that N-FET N2 is at maximum conductivity (with G2=VCCH) when node 15 is pulled down. When N-FET N1 is not conductive, then G2 is at VCCL and $V_{DS1}$ does not exceed VCCL-Vt.

The method of the invention can be described in other words. Node 15 which is coupled to ground reference line 93 via first transistor N1 and second transistor N2 is pulled down to ground 93 by N1 and N2 with the following steps:

Increasing the conductivity of second transistor N2 from low conductivity to high conductivity; and Making first transistor N1 conductive, whereby the voltage across the first and second electrodes (e.g., drains, sources) of first transistor N1 and second transistor N2 remain below a maximum allowable voltage (e.g., $V_{DSmax}$).

Preferably, both steps are executed simultaneously. The conductivity of first transistor N1 and second transistor N2 is controlled by first and second control signals G1 and G2, respectively, which are derived from a first signal (e.g., IN) at input terminal 12 and from a second signal (e.g., OUT) at node 15. Second signal at node 15 goes in the second direction (down), whereas first and second control signals G1, G2 go in the first direction (up).

Figure 5:
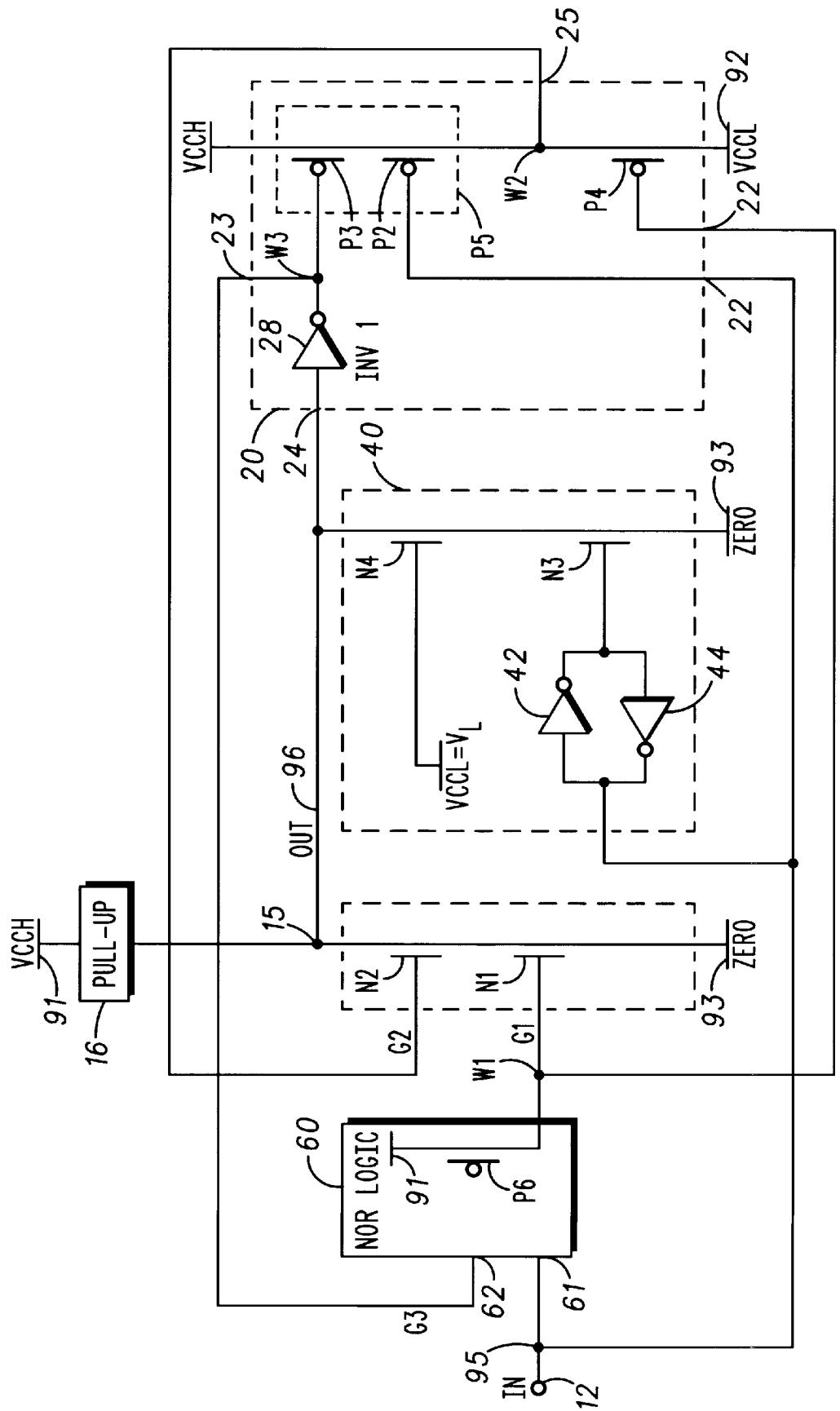
FIG. 5 is a simplified circuit diagram of the circuit of FIG. 3 in a preferred embodiment of the invention.

FIG. 5 is a simplified circuit diagram of circuit 10' in a preferred embodiment of the invention showing further details of the present invention. As shown in FIG. 5 enclosed by dashed lines, circuit 10' comprises control circuit 20, transistor pair 30, and retention circuit 40. Circuit 10' further comprises logic circuit 60, and node 15. Nodes W1, W2, and W3 carry first control signal G1, second control signal G2, and third control signal G3. Circuit 10' is coupled to first reference line 91 at VCCH, ground 93 at ZERO, and to second reference line 92 at VCCL. Node 15 is coupled to first reference line 91 via pull-up driver 16 whose construction is not essential for this embodiment. Transistor pair 30 of first transistor N1 and second transistor N2 have been described in connection with FIG. 3.

Transistor pair 30 receives signals G1 and G2 and supplies second signal OUT. In transistor pair 30, the source of first transistor N1 is coupled to ground 93. The drain of first transistor N1 is coupled to the source of second transistor N2. The drain of second transistor N2 is coupled to node 15 for providing OUT. The gate of transistor N1 is coupled to output 65 of logic circuit 60 via node W1. The gate of transistor N1 receives first control signal G1. The gate of transistor N2 is coupled to node W2 at output 25 of control circuit 20. The gate of transistor N2 receives second control signal G2.

Logic circuit 60 receives IN and third control signal G3 and provides first control signal G1. Logic circuit 60 has first input 61 coupled to input terminal 12 for receiving IN and second input 62 coupled to node W3 for receiving third control signal G3. Output 65 of logic circuit 60 is coupled to node W1 for providing second control signal G1. Logic circuit 60 has a logical disjunctive function (NOR-function). The function G1=f(IN, G3) can be expressed as:

G1=IN OR G3,     (1)

where the underscoring means logical inversion. It is assumed, that VCCH and ZERO express opposite logical values.

At output 65, logic circuit 60 has P-channel transistors for providing the VCCH level of G1. Collectively, these transistors are referred to and symbolized by first pull-up transistor P6. First pull-up transistor P6 has the source coupled to first reference line 91 and the drain coupled to output 65. The gate connection is not shown for simplicity. A person of skill in the art will be able to connect the gate to inputs 61 and 62 in order to operate logic circuit 60 according to function (1). The size of transistor P6 determines first increase rate dG1/dt of first control signal G1. The size of P6 is related to the size of P2 and P3 (second pull-up transistor P5) of control circuit 20.

Retention circuit 40 receives IN and retains second signal OUT. Retention circuit 40 comprises third transistor N3 and fourth transistor N4 and inverters 42 and 44. For convenience, the outputs of inverters 42 and 44 are shown in FIG. 5 by circles. Transistors N3 and N4 are N-channel FETs. In retention circuit 40, N-channel transistors N4 and N3 are coupled with the drain-source path between node 15 and ground 93. The drain of transistor N4 is coupled to node 15. The source of transistor N4 is coupled to the drain of transistor N3. The source of transistor N3 is coupled to ground 93. The gate of transistor N4 is coupled to second reference line 92 to receive VCCL. The gate of transistor N3 is coupled via inverters 42 and 44 to input terminal 12. The input and outputs of inverters 42 and 44 are cross-coupled. Inverters 42 and 44 provide an delayed IN to the gate of transistor N3.

In circuit 10', transistors N3 and N4 of retention circuit 40 are, preferably, smaller than transistors N1 and N2. Compared to transistor pair 30, transistors N3 and N4 do not pull node 15 to ZERO but keep it at ZERO. Transistors N3 and N4 have preferably different sizes. But this feature and the connection of the gate of transistor N4 to VCCL is not a disadvantage. The low conductivity of N4 is sufficient for keeping node 15 at ZERO.

Control circuit 20 receives output signal OUT, IN, first control signal G1 and supplies second control signal G2 and third control signal G3. Control circuit 20 comprises inverter 28 and P-channel transistors P2, P3, and P4. In control circuit 20, transistors P2, P3, and P4 are serially arranged with their source-drain paths between first reference line 91 and second reference line 92. The source of transistor P3 is coupled to first reference line 91. The drain of transistor P3 is coupled to the source of transistor P2. The drain of transistor P2 is coupled to the source of transistor P4 via node W2. The drain of transistor P4 is coupled to second reference line 92. The input of inverter 28 corresponds to input 24 of FIG. 3 and is coupled to node 15. The output of inverter 28 is coupled to node W3. The gate of transistor P3 is coupled to node W3. The gates of transistors P2 and P4 correspond to input 22. The gate of transistor P4 is coupled to node W1 for receiving second control signal G1. The gate of transistor P2 is coupled to input terminal 12 for receiving IN. Node W2 has the function of output 25 (FIG. 3) for supplying second control signal G2. P2 and P3 are collectively referred to as second pull-up transistor P5 (enclosed dashed). Assuming VCCH and ZERO to express opposite logical values, a conjunctive logical function G2=f(IN, OUT) can be given as:

G2=OUT AND IN,     (2)

where the underscoring means a logically inverted signal.

The size of P2 and P3 (P5) determines second increase rate dG2/dt of second control signal G2. Having second increase rate dG2/dt, preferably, smaller than first increase rate dG1/dt, G1 rises faster than G2. Preferably, transistors P2 and P3 have a smaller size than transistor P6 of logic circuit 60. This is a convenient feature of the invention which provides more drive to P6 compared to P5. Preferably, the size of second pull-up transistor P5 is about half the size of first pull-up transistor P6. Persons of skill in the art know how to provide devices having different drive capability.

Inverter 28 of control circuit 20 inverts output signal OUT and provides thereby a delayed third control signal G3. Inverter 28 is also a feedback inverter canceling oscillations. Third control signal G3 at output 23 (node W3) is used to switch transistor N1 off after OUT is at ZERO (logical "0"). This feature is convenient but not essential for this invention. It has been described in the patent application 'Output buffer with oscillation dumping'[4] which is incorporated herein. Reference [4] was filed at the USPTO on Nov. 20, 1995, for Motorola, Inc. and was assigned the Ser. No. 08/559,864 now U.S. Pat. No. 5,729,153.

The interaction of control circuit 20, logic circuit 60, and transistor pair 30 will now be explained. For the purpose of explanation, it is assumed that node W3 of control circuit 20 is not connected to input 62 of logic circuit 60. Logic circuit 60 has then the simplified logical function G1=IN. In control circuit 20, transistor P4 receives first control signal G1, transistor P2 receives IN, and transistor P3 receives third control signal G3. Pull-up transistor P5 pulls second control signal G2 to VCCH for G3=ZERO and IN=ZERO. Transistor P4 pulls signal G2 to VCCL for G1=ZERO.

It will now be explained in reference to the signal-time-diagram of FIG. 4 how control circuit 20, retention circuit 40 and logic circuit 60 interact with transistor pair 30. At a time before t1, OUT is at VCCH (trace 31), and third control signal G3 (output 23 of control circuit 20) is at G3=ZERO. IN is at VCCH. Second control signal G1 at the gate of first transistor N1 is at G1=ZERO (trace 11). Transistor N1 is not conductive. In control circuit 20, transistor P3 receives G3=0 and is conductive. Transistor P2 receives IN=VCCH and is not conductive. Transistor P4 receives G1=0 and pulls node W2 to second reference line 92. Second control signal G2 at node W2 and the gate of transistor N2 is therefore at VCCL (trace 21).

Beginning at time t=t1, IN falls to IN=ZERO. First control signal G1 goes to VCCH (trace 12). Node W3 (signal G3) is still at ZERO so that transistor P3 remains conductive. IN=ZERO makes transistor P2 conductive. G1=VCCH makes transistor P4 non-conductive. Node W2 is pulled to first reference line 91. Therefore second control signal G2 goes to VCCH (trace 22). G1=VCCH makes transistor N1 conductive so that node 15 is pulled to ground 93 and output signal OUT goes to ZERO (trace 32) beginning with t2. The voltage of OUT is distributed between transistors N1 and N2; and neither $V_{DS}$ exceeds $V_{DSmax}$.

Figure 1:
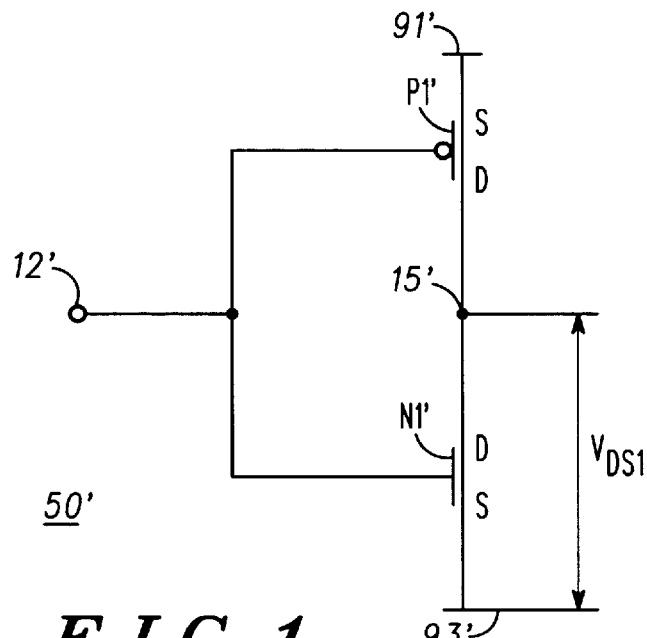
FIG. 1 is a simplified circuit diagram of an prior art input-output circuit.
Figure 2:
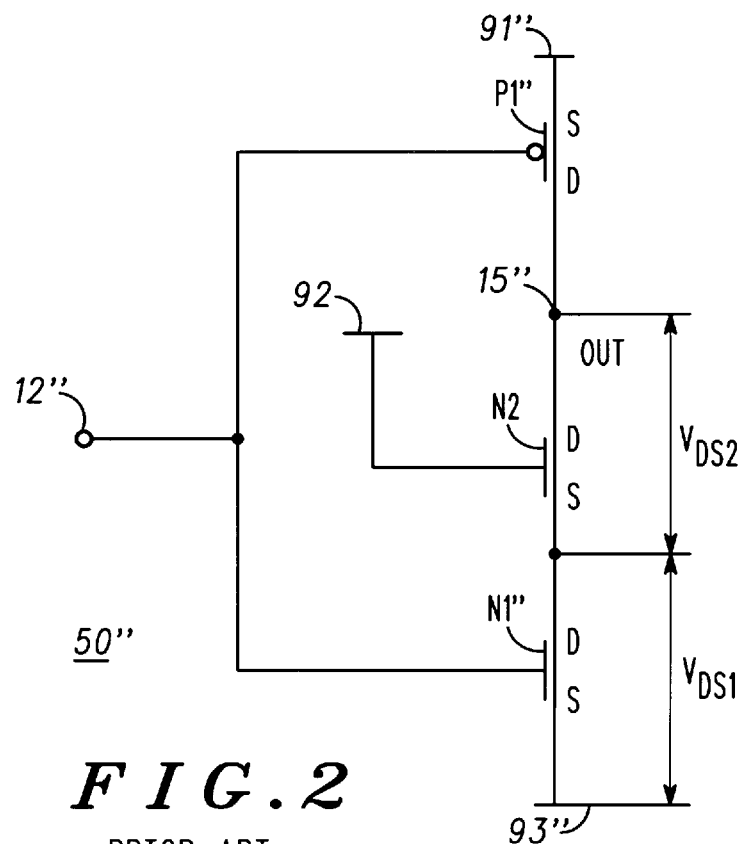
FIG. 2 is a simplified circuit diagram of a further prior art input-output circuit.

Circuit 10' of the preferred embodiment of the invention (FIG. 5) and prior art circuit 50 (FIG. 2) have been compared by simulation. The fall time $T_F$ of output signal OUT have been determined depending on the dimensions of transistors N1 and N2. The simulation method was SPICE, but other simulation methods well known in the art will lead to comparable results.

Table 1 shows by way of example the relation between channel widths W1 and W2 of transistors N1 and N2, respectively, and the fall time $T_F$. The channel widths is given in micro meter (μm). The fall time are defined as in the signal-time diagram of FIG. 4 ($T_F$=t4–t2) and given in nano seconds (ns). In prior art circuit 50 (columns 3-4), the gate of transistor N2 (second control signal G2) is constantly at VCCL=1.8 volts. In circuit 10' of the invention (column 2), the gate of transistor N2 (second control signal G2) has been switched between VCCH=3.6 volts and VCCL=1.8 volts according to the method of the invention.

TABLE 1

| (1) | (2) present invention circuit 10' | (3) prior art circuit 50 | (4) |
| --- | --- | --- | --- |
| given channel widths | | | |
| $W_2$/μm (of N2) | 400 | 1200 | 600 |
| $W_1$/μm (of N1) | 400 | 800 | 400 |
| resulting fall time $T_F$/ns | 3.6 | 4.8 | 6.7 |

The environment in which the circuits of the example are to be used, demands a fall time $T_M$ of $T_M$=5 ns or less. Longer fall times (>5) are unacceptable and should be avoided. A fall time $T_F$=4.8 ns can be obtained with a prior art circuit 50 having a $W_2/W_1$ ratio of preferably 1.5 (column 3). The overall width $W_1+W_2$ equals 2000 μm. Circuit 10' of the present invention (column 2) achieves an even shorter fall time $T_F$=3.6 ns. The overall width of $W_1+W_2$=800μm of circuit 10' is 40% of the overall width in prior art circuit 50. However, with the design of prior art circuit 50, a reduction of the overall width (e.g., column 4,000 μm) would result in an unacceptable resulting fall time $T_F$=6.7 ns.

As in the example of circuit 10' (column 2), the ratio R=VCCL/VCCH between second and first level of G2 is about 50%. This ratio R has a convenient but not essential value. Ratio R has a usefully value of 40%<R<80%, and, preferably, of 50%<R<70%.

The circuit according to the invention comprises a first and a second transistor serially coupled to a node. The first transistor is gated by a first control signal and is either conductive or not conductive. The second transistor is controlled by a control circuit and gated by a second control signal. The second transistor has either a high conductivity or a low conductivity. The second control signal alternatively has a first level (VCCH) and a second level (VCCL). The control circuit is coupled to the node and to the input terminal. The conductivity of the second transistor can be adjusted during operation of the circuit. Compared to prior art solutions, the required silicon area and the delay time are reduced. As a further advantage, the circuit of the present invention is better protected against hot-carrier induced degradation.

In the foregoing detailed description of the preferred embodiment, reference was made to the accompanying drawings which form a part hereof, and in which were shown by way of illustration a specific embodiment in which the invention may be practiced. This embodiment has been described in sufficient detail to enable those skilled in the art to practice the invention, and it is to be understood that other embodiments may be utilized and that logical, mechanical and electrical changes may be made without departing from the spirit and scope of the present invention. The foregoing detailed description is, therefore, not to be taken in a limiting sense, and the scope of the present inventions is defined only by the appended claims.

In the claims, the term 'circuit' is intended to include circuit 10 of FIG. 3 and its preferred embodiment as circuit 10' of FIG. 5.

We claim:

1. A circuit comprising:
   a first transistor and a second transistor, each having a first electrode and a second electrode and a control electrode, said first transistor and said second transistor being serially coupled across their first and second electrodes between a node and a ground reference line for pulling said node to said ground reference line, wherein the second electrode of said first transistor is coupled to said ground reference line and the first electrode of said second transistor is coupled to said node, said first transistor being conductive or substantially not conductive in response to a first control signal, said first control signal being related to a first signal; said second transistor being conductive with a first, high conductivity or with a second conductivity, lower than said first conductivity, in response to a second control signal, said second control signal alternating between a first level and a second level both larger than a threshold value of said second transistor so that said second transistor is always conductive; and a control circuit receiving said first signal and providing said first control signal and said second control signal which in a first case causes said first conductivity of said second transistor when said first signal makes said first transistor fully conductive, and which in a second case causes said second conductivity of said second transistor responsive to said first transistor and said second transistor having pulled said node to said ground reference line, thereby in said second case equalizing the voltages across said first electrodes and said second electrodes of said first transistor and said second transistor so that said circuit can accommodate said first signal at said first level which is higher than the maximum allowable voltages across said first and second main electrodes of said first transistor or said second transistor.

2. The circuit of claim 1 wherein said first transistor and said second transistor are N-channel field effect transistors having sources as first main electrodes, having drains as second main electrodes and gates as control electrodes.

3. A circuit comprising:
a first transistor and a second transistor, each having a first electrode and a second electrode and a control electrode, said first transistor and said second transistor being serially coupled across their first and second electrodes between a node and a ground reference line for pulling said node to said ground reference line, said first transistor being conductive or substantially not conductive in response to a first control signal, said first control signal being related to a first signal; said second transistor being conductive with a first, conductivity or with a second conductivity, lower than said first conductivity, in response to a second control signal;

a control circuit receiving said first signal and providing said second control signal which causes in a first case said first conductivity of said second transistor when said first signal makes said first transistor fully conductive, and which in a second case causes said second conductivity of said second transistor responsive to said first transistor and said second transistor having pulled said node to said ground reference line, thereby in said second case equalizing the voltages across said first electrodes and said second electrodes of said first transistor and said second transistor so that said circuit can accommodate said first signal at said first level which is higher than the maximum allowable voltages across said first and second main electrodes of said first transistor or said second transistor; and a logic circuit providing said first control signal, said logic circuit having a first input coupled to an input terminal for receiving said first signal and an output for providing said first control signal, said logic circuit comprising a first pull-up transistor having first and second main electrodes coupled between a first reference line and said output, and wherein said control circuit providing said second control signal comprises a second pull-up transistor having first and second main electrodes coupled between said first reference line and the control input of said second transistor.

4. A circuit comprising:
a first transistor and a second transistor, each having a first electrode and a second electrode and a control electrode, said first transistor and said second transistor being serially coupled across their first and second electrodes between a node and a ground reference line for pulling said node to said ground reference line, said first transistor being conductive or substantially not conductive in response to a first control signal, said first control signal being related to a first signal; said second transistor being always conductive with a first, high conductivity or with a second conductivity, lower than said first conductivity, in response to a second control signal;

a control circuit receiving said first signal and providing said first control signal and said second control signal which in a first case causes said first conductivity of said second transistor when said first signal makes said first transistor fully conductive, and which in a second case causes said second conductivity of said second transistor responsive to said first transistor and said second transistor having pulled said node to said ground reference line, thereby in said second case equalizing the voltages across said first electrodes and said second electrodes of said first transistor and said second transistor so that said circuit can accommodate said first signal at said first level which is higher than the maximum allowable voltages across said first and second main electrodes of said first transistor or said second transistor; and a retention circuit having a third transistor and a fourth transistor serially coupled between said node and a ground reference line for keeping said node at said ground reference line, said retention circuit receiving said first signal with a delay, a control electrode of said fourth transistor being coupled to a second reference line.

5. The circuit of claim 1 wherein said first and second levels of said second control signal have a ratio therebetween in the range of 40% and 80%.

6. The circuit of claim 1 wherein said first and second levels of said second control signal have a ratio therebetween in the range of 50% and 70%.

7. The circuit of claim 1 wherein said control circuit receives a second signal from said node and wherein said second control signal causes high conductivity of said second transistor when said node is at a first level.

8. A method for pulling a node to a ground reference potential by serially coupled first and second transistors, said first transistor being coupled to said ground reference potential and said second transistor being coupled to said node, said method comprising the following steps:
increasing the conductivity of said second transistor from low to high, wherein said second transistor is always being conductive; and
making said first transistor conductive, whereby voltages across main electrodes of said first transistor and said second transistor each remain below a maximum allowable voltage for each transistor.

9. The method of claim 8 wherein said steps are performed simultaneously.

10. The method of claim 8 wherein said first transistor is made conductive at a first increase rate which is higher than a second increase rate by which the conductivity of said second transistor is increased.

11. The method of claim 8 wherein said first transistor is made conductive by a first control signal provided by a first pull-up transistor and wherein said conductivity of said second transistor is increased by a second control signal provided by a second pull-up transistor, said first pull-up transistor having more drive that said second pull-up transistor, so that first control signal changes faster than said second control signal.

12. A circuit comprising:

a first transistor and a second transistor being serially coupled between a node and a ground reference line, said first transistor being connected to said ground reference line and said second transistor being connected to said node, said first transistor and said second transistor having variable conductivities, said first transistor changing between being conductive or substantially not conductive in response to a first signal, said second transistor being always conductive and changing between having high or low conductivity; and a control circuit alternatively causing that the conductivity of said second transistor increases from low conductivity to high conductivity when said first signal makes said first transistor conductive; and causing that the conductivity of said second transistor decreases from high conductivity to low conductivity when said first signal makes said first transistor non conductive.

* * * * *